(12) United States Patent
Srinivasan et al.

(10) Patent No.: US 12,326,749 B2
(45) Date of Patent: Jun. 10, 2025

(54) SUPPLY VOLTAGE CONTROL SYSTEMS AND METHODS FOR INTEGRATED CIRCUITS (71) Applicant: Intel Corporation, Santa Clara, CA (US)

(72) Inventors: Archanna Srinivasan, San Jose, CA (US); Ravi Gutala, San Jose, CA (US); Scott Weber, Piedmont, CA (US); Aravind Dasu, Milpitas, CA (US); Mahesh Iyer, Fremont, CA (US); Eriko Nurvitadhi, Beaverton, OR (US)

(73) Assignee: Altera Corporation, San Jose, CA (US)

( * ) Notice: Subject to any disclaimer, the term of this patent is extended or adjusted under 35 U.S.C. 154(b) by 816 days.

(21) Appl. No.: 17/351,747

(22) Filed: Jun. 18, 2021

(65) Prior Publication Data
US 2021/0311537 A1 Oct. 7, 2021

(51) Int. Cl.
G05F 1/66 (2006.01)
G06F 1/28 (2006.01)
H01L 25/065 (2023.01)
H03K 19/00 (2006.01)

(52) U.S. Cl.
CPC ............... G05F 1/66 (2013.01); G06F 1/28 (2013.01); H01L 25/0655 (2013.01); H03K 19/0016 (2013.01)

(58) Field of Classification Search
CPC ... G06F 1/26; G06F 1/32; G06F 1/324; G06F 1/3243; G06F 1/3203; G05F 1/575; G05F 1/577
See application file for complete search history.

(56) References Cited

U.S. PATENT DOCUMENTS

| | | | |
|---|---|---|---|
| 8,719,600 B2 | 5/2014 | Gunther et al. | |
| 10,345,881 B2 | 7/2019 | Muthukaruppan et al. | |
| 10,833,679 B2 | 11/2020 | Clark et al. | |
| 2006/0282692 A1 | 12/2006 | Oh | |
| 2014/0223205 A1 | 8/2014 | Muthukaruppan et al. | |
| 2015/0168972 A1* | 6/2015 | Mathiyalagan | H01L 23/50 327/540 |

(Continued)

OTHER PUBLICATIONS

European Patent Office, Extended European Search Report and European Search Opinion for European patent application 22160224.6 dated Aug. 25, 2022.

Primary Examiner — Alex Torres-Rivera
(74) Attorney, Agent, or Firm — InventIQ Legal LLP; Steven J. Cahill (57) ABSTRACT A circuit system includes a power control circuit that generates multiple voltage identifiers. Multiple voltage regulator circuits generate multiple supply voltages based on the voltage identifiers. The supply voltages are provided to multiple integrated circuit dies. The power control circuit varies the voltage identifiers based on changes in metrics associated with the integrated circuit dies to cause the voltage regulator circuits to vary the supply voltages. Integrated circuit dies receive supply voltages from voltage regulator circuits through power delivery networks. The integrated circuit dies provide voltage sense signals that indicates the supply voltages. The voltage regulator circuits adjust the supply voltages based on the voltage sense signals to compensate for voltage drops in the power delivery networks.

20 Claims, 4 Drawing Sheets (56) References Cited

U.S. PATENT DOCUMENTS

| | | |
|---|---|---|
| 2017/0031411 A1* | 2/2017 | Muthukaruppan ........ G06F 1/32 |
| 2017/0083067 A1* | 3/2017 | Ganor ....................... G06F 1/26 |
| 2019/0041923 A1 | 2/2019 | Atsatt et al. |
| 2019/0042127 A1 | 2/2019 | Weber et al. |
| 2019/0043536 A1 | 2/2019 | Weber et al. |
| 2019/0044514 A1 | 2/2019 | Srinivasan et al. |
| 2019/0044515 A1 | 2/2019 | Gutala et al. |
| 2019/0044519 A1 | 2/2019 | Atsatt et al. |
| 2019/0296644 A1* | 9/2019 | Huang ....................... G06F 1/26 |
| 2020/0119736 A1 | 4/2020 | Weber et al. |
| 2022/0147131 A1* | 5/2022 | Rehmeyer ............. G06F 1/3275 |

* cited by examiner

SUPPLY VOLTAGE CONTROL SYSTEMS AND METHODS FOR INTEGRATED CIRCUITS

FIELD OF THE DISCLOSURE

The present disclosure relates to electronic circuit systems and methods, and more particularly, to supply voltage control systems and methods for integrated circuits.

BACKGROUND

Many integrated circuit (IC) packages contain multiple integrated circuit dies. Integrated circuit dies in an IC package may, for example, be coupled together through an interposer, an interconnection bridge, or a package substrate. The supply voltage for each integrated circuit die in an IC package may be provided by one or more on-package or on-board voltage regulators. The integrated circuit dies in an IC package may operate using the same supply voltage or different supply voltages provided by the one or more voltage regulators.

DETAILED DESCRIPTION

In many circuit systems that contain multiple integrated circuit (IC) dies within an IC package, the application requirements of each IC die in the IC package may vary at different times and between IC dies. For example, different IC dies in an IC package may have different performance targets, different frequency targets, and different power consumption targets. In addition, the workload, the performance target, the frequency target, and the power consumption target of each IC die in an IC package may change over time during the operation of the circuit system.

According to some embodiments disclosed herein, variable supply voltages are provided to multiple integrated circuit (IC) dies in a circuit system. The IC dies may, for example, be contained in an IC package or other housing. A power control circuit in the circuit system generates a voltage identifier (VID) for each IC die. The VID may be, for example, a digital code. The voltage identifiers (VIDs) are provided to voltage regulators in the circuit system. Each of the voltage regulators generates a supply voltage based on one of the VIDs. Each supply voltage is provided to one of the IC dies in the circuit system. The power control circuit can change the VIDs based on changes in the workloads, the performance targets, the frequency targets, the power consumption targets, and other metrics of the IC dies. The changes in the VIDs cause the voltage regulators to adjust the supply voltages to values that optimize the performance of the IC dies in response to changes in the workloads, performance targets, frequency targets, power consumption targets, and other metrics.

Throughout the specification, and in the claims, the term "connected" means a direct electrical connection between the circuits that are connected, without any intermediary devices. The term "coupled" means either a direct electrical connection between circuits or an indirect connection through one or more passive or active intermediary devices. The term "circuit" may mean one or more passive and/or active electrical components that are arranged to cooperate with one another to provide a desired function.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Figure 1:
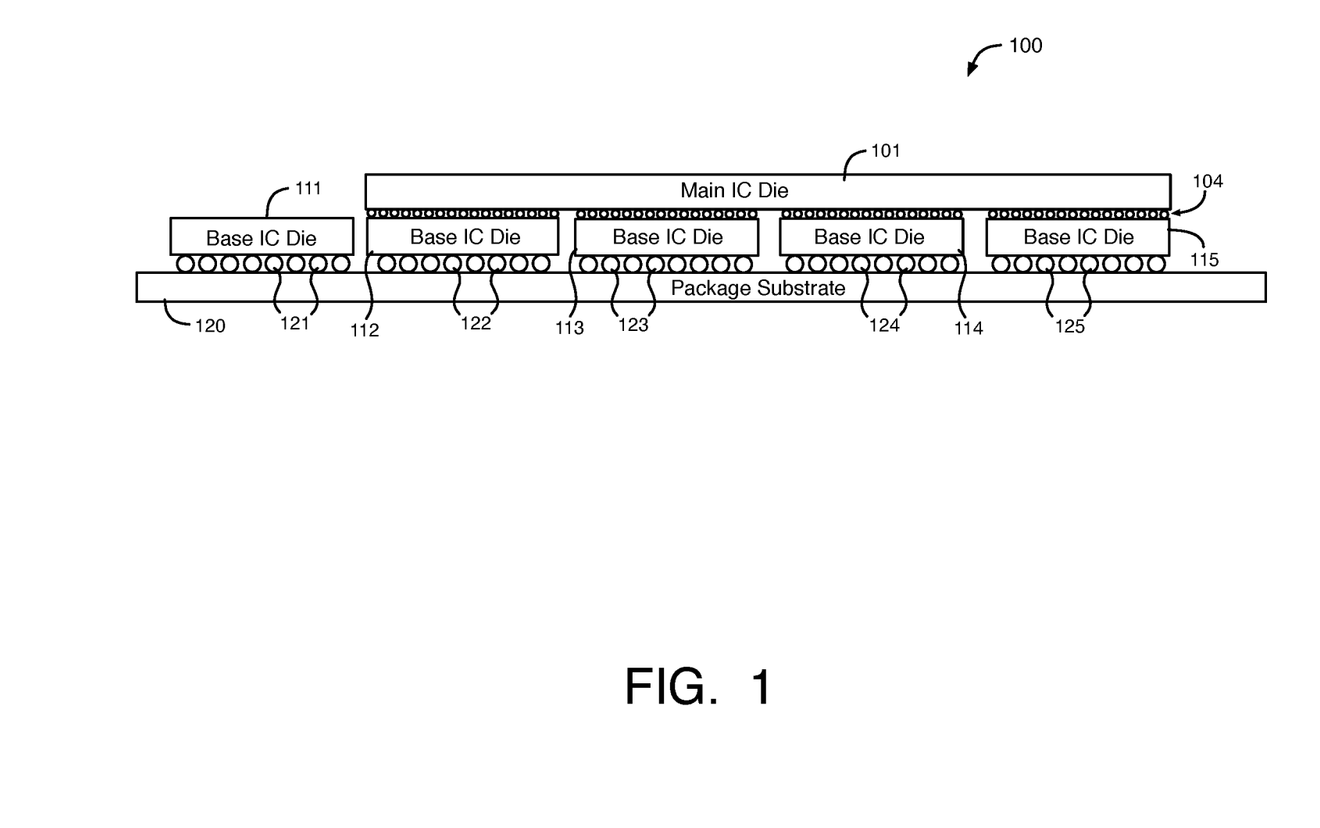
FIG. 1 illustrates a cross section of an exemplary integrated circuit (IC) package having a circuit system that includes a main integrated circuit (IC) die, 5 base IC dies, and a package substrate, according to an embodiment.

FIG. 1 illustrates a cross section of an exemplary integrated circuit (IC) package 100 having a circuit system that includes a main integrated circuit (IC) die 101, 5 base IC dies 111-115, and a package substrate 120, according to an embodiment. The main IC die 101 may be any type of IC die, such as a programmable logic IC (e.g., a field programmable gate array), a microprocessor IC, a graphics processing unit (GPU) IC, etc. Base IC dies 111-115 may also be any types of IC dies, such as memory ICs, programmable logic ICs (e.g., FPGAs), microprocessor ICs, GPU ICs, etc.

The main IC die 101 and the base IC dies 112-115 are vertically stacked and coupled together as shown in FIG. 1 to create a three dimensional (3D) circuit system. The main IC die 101 is coupled to each of the base IC dies 112-115 through conductive bumps 104. Base IC dies 112-115 can communicate with main IC die 101 via bumps 104. The base IC dies 111-115 are coupled to the package substrate 120 through conductive bumps 121-125, respectively. Base IC die 111 can communicate with main IC die 101, for example, via bumps 121, conductors in package substrate 120, one or more sets of bumps 122-125, through silicon vias in one or more of base IC dies 112-115, and bumps 104.

Figure 2:
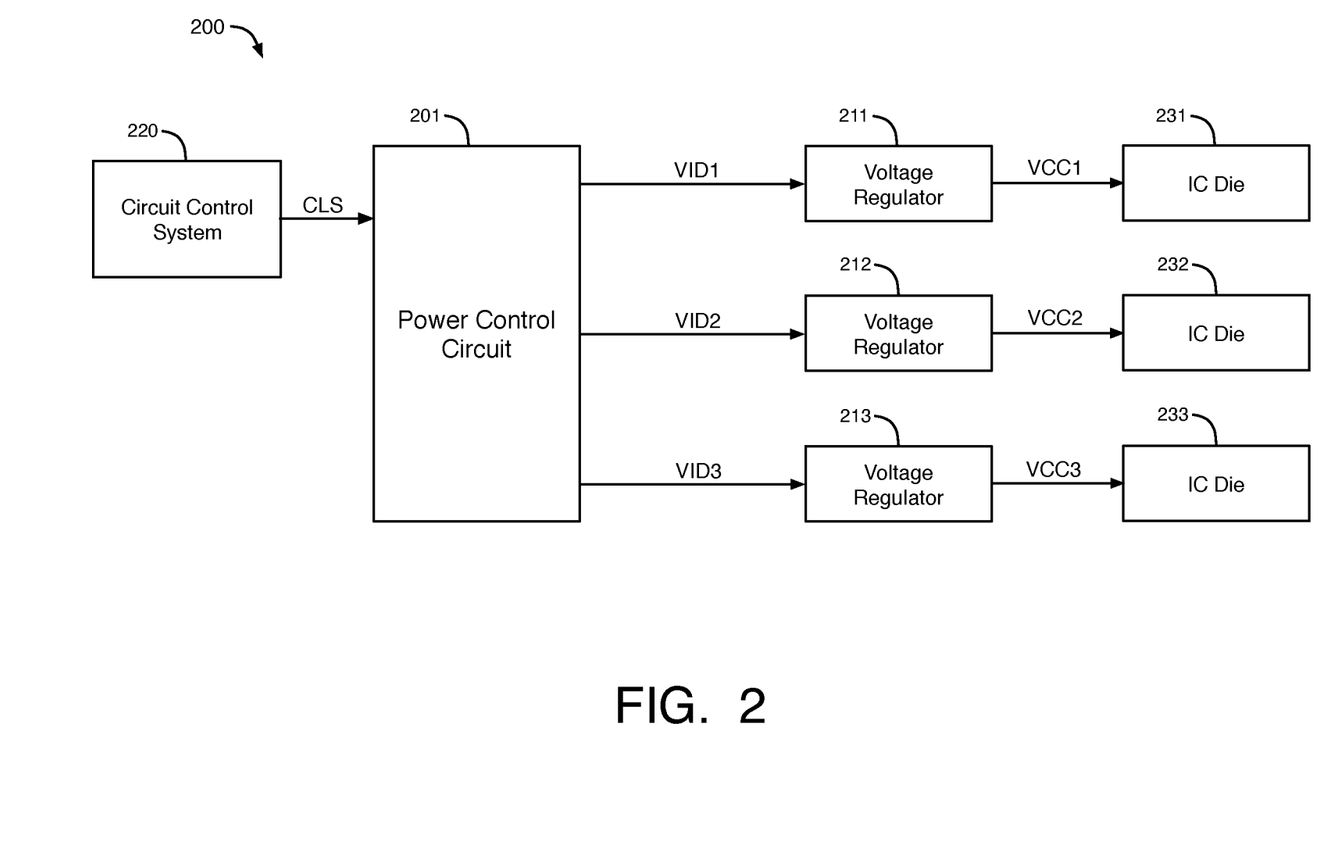
FIG. 2 illustrates an example of a power control system that generates variable supply voltages for multiple integrated circuit (IC) dies in a circuit system, according to an embodiment.

FIG. 2 illustrates an example of a power control system 200 that generates variable supply voltages for multiple integrated circuit (IC) dies in a circuit system, according to an embodiment. The power control system 200 of FIG. 2 includes a power control circuit 201, three voltage regulator circuits 211-213, a circuit control system 220, and IC dies 231-233. The power control circuit 201 and the three voltage regulator circuits 211-213 may be, for example, inside or outside the IC package 100 of FIG. 1. For example, power control circuit 201 and the three voltage regulator circuits 211-213 may be located in any of the integrated circuits 101 and/or 111-115 of FIG. 1. IC dies 231-233 may, for example, be three of the base IC dies 111-115. In an embodiment, one of the IC dies 231-233 may be main IC die 101. In other embodiments, IC dies 231-233 may be located in another IC package or another type of circuit system. Each of the IC dies 231-233 may be any type of IC die, such as a programmable logic IC (e.g., a field programmable gate array), a microprocessor IC, a GPU IC, a memory IC, etc.

Voltage regulator circuits 211-213 may be any types of voltage regulators, such as, for example, switching voltage regulators or linear voltage regulators. In some embodiments, voltage regulator circuits 211-213 may be fully integrated voltage regulators that are located inside IC dies 231, 232, and 233, respectively. In other embodiments, voltage regulator circuits 211-213 may be fully integrated voltage regulators that are located in main IC die 101 or in any one or more of the base IC dies 111-115. In still other embodiments, voltage regulator circuits 211-213 may be any combination of in-package voltage regulators (e.g., in IC package 100) or on-board voltage regulators coupled to a circuit board.

The circuit control system 220 may be located outside of IC package 100. Circuit control system 220 may be implemented on computing equipment that may include, for example, one or more networked computers with processors, memory, mass storage, input/output devices, etc. The processor(s) may be linked using a network (e.g., a local or wide area network). Memory in these computers or external memory and storage devices may be used to store instructions and data. Circuit control system 220 may include software-based components such as computer-aided design (CAD) tools and databases. The CAD tools may, for example, be used to generate a circuit design for main IC die 101 or any of the base IC dies 111-115. During operation, executable software such as the software of system 220 may run on the processor(s). In general, software and data may be stored in non-transitory computer readable storage media (e.g., tangible computer readable storage media). The software code may sometimes be referred to as software, data, program instructions, instructions, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Circuit control system 220 may include timing analysis tools that can be used to dynamically evaluate performance requirements (e.g., timing requirements) of the IC dies in a circuit system (e.g., main IC die 101, base IC dies 111-115, and IC dies 231-233). Circuit control system 220 may also include tools that are used to dynamically evaluate the workloads, the application needs, the frequency targets, the power consumption targets, and other metrics of the IC dies in the circuit system, such as main IC die 101, base IC dies 111-115, and IC dies 231-233. Circuit control system 220 can dynamically monitor changes in any metrics of the IC dies in the circuit system (such as the performance requirements, workloads, frequency targets, power consumption targets, and application needs) during operation of the circuit system. Circuit control system 220 generates control signals CLS that can indicate changes in any of the metrics of the IC dies in the circuit system that can be affected by variations in the supply voltages provided to the IC dies in the circuit system. For example, circuit control system 220 can generate control signals CLS that indicate changes in the performance requirements, workloads, frequency targets, power consumption targets, and application needs of IC dies 231-233.

Control signals CLS are provided to inputs of power control circuit 201. Power control circuit 201 generates voltage identifiers (VIDs) VID1, VID2, and VID3 for the three IC dies 231-233, respectively, based on the control signals CLS. Each of the VIDs may be output as one or more digital or analog signals. For example, each of the VIDs may be a parallel or serial digital code. Voltage identifiers VID1, VID2, and VID3 are provided to inputs of voltage regulator circuits 211-213, respectively. Voltage regulator circuits 211-213 generate supply voltages VCC1, VCC2, and VCC3 based on the values of voltage identifiers VID1, VID2, and VID3, respectively. The supply voltages VCC1, VCC2, and VCC3 are provided to supply inputs of IC dies 231, 232, and 233, respectively, through three different power delivery networks.

Power control circuit 201 can independently set any of the voltage identifiers VID1, VID2, and VID3 based on any of the metrics that are indicated by control signals CLS to cause the respective voltage regulator circuits 211-213 to generate desired supply voltages VCC1-VCC3. Power control circuit 201 can independently adjust any one or more of the voltage identifiers VID1-VID3 based on changes in any of the metrics indicated by signals CLS to cause the respective voltage regulators 211-213 to adjust the respective supply voltages VCC1-VCC3 in order to affect metrics of one or more of the respective IC dies 231-233.

For example, power control circuit 201 can change one or more of voltage identifiers VID1-VID3 to values that cause the respective voltage regulators 211-213 to decrease the respective supply voltages VCC1-VCC3 in response to changes in control signals CLS that indicate that the power consumption targets for the respective IC dies 231-233 have decreased. Decreasing supply voltages VCC1-VCC3 may decrease power consumption in the respective IC dies 231-233. As another example, power control circuit 201 can adjust one or more of voltage identifiers VID1-VID3 to values that cause the respective voltage regulators 211-213 to increase the respective supply voltages VCC1-VCC3 in response to changes in control signals CLS that indicate that the timing requirements for the respective IC dies 231-233 have decreased (e.g., less time is allowed for signal transmission) or the frequency targets for the respective IC dies 231-233 have increased. Increasing supply voltages VCC1-VCC3 may allow the frequencies of signals in the respective IC dies 231-233 to be increased and the timing requirements of signals in the respective IC dies 231-233 to be achieved more easily.

As yet another example, power control circuit 201 can adjust one or more of voltage identifiers VID1-VID3 to values that cause the respective voltage regulators 211-213 to increase their respective supply voltages VCC1-VCC3 in response to changes in control signals CLS that indicate that the workloads of the respective IC dies 231-233 have increased. Increasing supply voltages VCC1-VCC3 may allow IC dies 231-233 to increase their workloads (e.g., process more data). Power control circuit 201 may also adjust any of voltage identifiers VID1-VID3 to cause the respective supply voltages VCC1-VCC3 to decrease in response to signals CLS indicating that the workload of the respective IC dies 231-233 have decreased. Power control circuit 201 can continuously or periodically adjust one or more of the voltage identifiers VID1-VID3 independently to adjust the respective supply voltages VCC1-VCC3 in order to compensate for changes in the workload of the respective IC dies 231-233 during operation.

Power control circuit 201 can independently change one of the voltage identifiers (VIDs) without changing the other voltage identifiers. Power control circuit 201 can also independently change two or more of the voltage identifiers VID1-VID3 by different values to cause two or more of the respective supply voltages VCC1-VCC3 to change by different voltages. For example, power control circuit 201 may adjust one voltage identifier to cause the respective supply voltage to increase in response to signals CLS indicating that the workload of the respective one of IC dies 231-233 has increased, and power control circuit 201 may adjust another voltage identifier to cause a different respective supply voltage to decrease in response to signals CLS indicating that the workload of a different respective one of the IC dies 231-233 has decreased.

In some embodiments, the three IC dies 231-233 may be grouped into bins according to semiconductor process variations that occur during fabrication. In these embodiments, the power control circuit 201 may initially set the values of the voltage identifiers VID1-VID3 based on the process variations between the three IC dies 231-233. Power control circuit 201 may then dynamically change the voltage identifiers VID1-VID3 based on any of the metrics for the three IC dies 231-233, respectively, (e.g., workload, power requirements, performance requirements, etc.) as indicated by the control signals CLS generated by the circuit control system 220.

In some embodiments, the voltage regulator circuits 211-213 may be fully integrated voltage regulator circuits (FIVRs) that are located in a single integrated circuit die (e.g., any of IC dies 101 or 111-115) for more fine-grained supply voltage control. If main IC die 101 is a field programmable gate array (FPGA) that contains voltage regulator circuits 211-213, design software in circuit control system 220 may have knowledge of the timing criticality of every portion of user logic during optimization of the FPGA to best fit user logic in the FPGA. The design software can consider the locations of the fine-grained FIVRs in the FPGA when the software packs logic into the FPGA fabric resources. If the design software packs similar timing critical logic together, the voltages of the associated FIVRs can be adjusted to meet the timing requirements of the logic serviced by the FIVRs. Based on timing criticality information from the design software, the design software can control power control circuit 201 to adjust the supply voltages accordingly to reduce power consumption. Particularly, non-critical logic can be driven with a lower supply voltage (determined without making the logic critical-within the slack margin). The power control circuit 201 can, for example, be built in soft logic. These features provide workload-dependent supply voltage control and power reduction.

A supply voltage may be provided to each of the IC dies 101 and 111-115 in the circuit system of FIG. 1, as shown, for example, in FIG. 2. The supply voltages may be provided to the IC dies 101 and 111-115 through conductors in power delivery networks that are routed through IC package 100 (e.g., through bumps 104, bumps 121-125, and/or conductors in package substrate 120) and within each of the IC dies. The conductors in the power deliver networks typically have resistances that cause IR voltage drops in the supply voltages transmitted through the power delivery networks. IR refers to current times resistance (i.e., V=IR). The IR voltage drops in the power delivery networks cause circuits (e.g., transistors) inside of the IC dies 101, 111-115, and 231-233 to receive supply voltages that are less than the desired nominal supply voltages. When the circuits inside of the IC dies 101, 111-115, and 231-233 receive supply voltages that are less than the desired nominal supply voltages, the circuits in the IC dies may not meet target metrics, such as power consumption, frequency, and timing. Therefore, it would be desirable to provide a system for sensing and compensating for IR voltage drops in supply voltages that are provided to IC dies in a circuit system.

Figure 3:
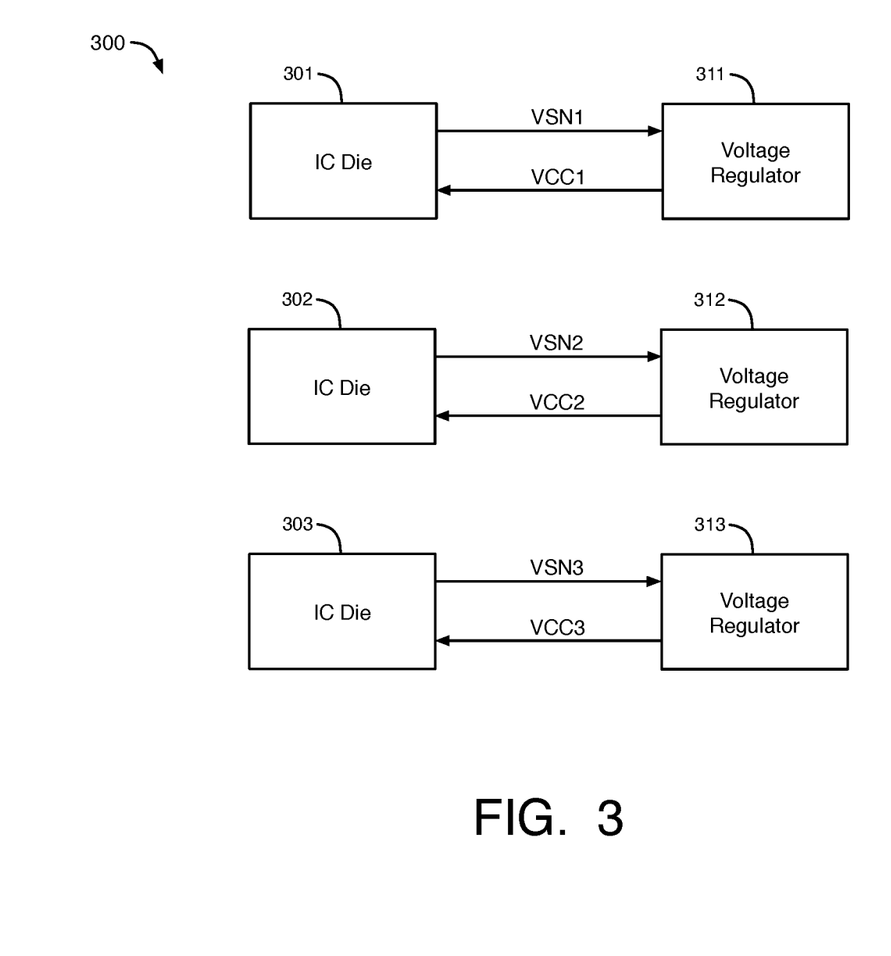
FIG. 3 illustrates an example of a circuit system for sensing and compensating for IR voltage drops in three supply voltages provided to three integrated circuit dies, according to an embodiment.

FIG. 3 illustrates an example of a circuit system 300 for sensing and compensating for IR voltage drops in three supply voltages provided to three integrated circuit (IC) dies, according to an embodiment. Circuit system 300 includes three IC dies 301-303 and three voltage regulator circuits 311-313. The IC dies 301-303 and the voltage regulator circuits 311-313 may be in the same IC package or in different IC packages. The IC dies 301-303 and the voltage regulator circuits 311-313 may, for example, be inside or outside of the IC package 100 of FIG. 1. Voltage regulator circuits 311-313 may, for example, be on-board voltage regulators, in-package voltage regulators in IC package 100, or fully integrated voltage regulators that are in any of the integrated circuit dies 101 and/or 111-115 of FIG. 1. In some embodiments, the voltage regulator circuits 311-313 may be fully integrated voltage regulator circuits (FIVRs) that are located in a single integrated circuit die (e.g., any of IC dies 101 or 111-115) for more fine-grained supply voltage control. IC dies 301-303 may, for example, be three of the base IC dies 111-115. In an embodiment, one of the IC dies 301-303 may be main IC die 101. In other embodiments, IC dies 301-303 may be located in another IC package or another type of circuit system. Each of the IC dies 301-303 may be any type of IC die, such as a programmable logic IC (e.g., a field programmable gate array), a microprocessor IC, a GPU IC, a memory IC, etc.

In circuit system 300, voltage regulator circuits 311, 312, and 313 generate three supply voltages VCC1, VCC2, and VCC3, respectively. Supply voltages VCC1, VCC2, and VCC3 are provided through conductors (shown as arrows in FIG. 3) in three different power delivery networks (i.e., conductors that couple together IC dies) to supply inputs of IC dies 301, 302, and 303, respectively. Supply voltages VCC1, VCC2, and VCC3 are provided from the supply inputs through conductors in power delivery networks inside IC dies 301, 302, and 303 to circuits (e.g., transistors) within the IC dies 301, 302, and 303, respectively. The conductors in the power delivery networks may cause IR voltage drops in the supply voltages VCC1, VCC2, and VCC3, as discussed above. IR voltage drops in supply voltages VCC1-VCC3 may degrade circuit performance in IC dies 301-303, respectively.

Therefore, IC dies 301, 302, and 303 generate three voltage sense signals VSN1, VSN2, and VSN3 that are used to compensate for the IR voltage drops in the supply voltages VCC1, VCC2, and VCC3, respectively. Voltage sense signals VSN1, VSN2, and VSN3 equal the voltages of VCC1, VCC2, and VCC3 within (or near the outside surfaces of) the IC dies 301, 302, and 303, respectively. Voltage sense signals VSN1, VSN2, and VSN3 may be coupled to the power delivery networks within (or outside of) the IC dies 301, 302, and 303, respectively. As an example, the voltage sense signals VSN1, VSN2, and VSN3 may be coupled to conductive bump layers or to conductive layers of the power delivery networks within the IC dies 301-303, respectively. If the voltage sense signals VSN1-VSN3 are coupled to conductive layers (e.g., metal layers) within the IC dies 301-303, then the voltage sense signals VSN1-VSN3 can be used to compensate for IR voltage drops within the power delivery networks of the IC dies 301-303 and for IR voltage drops in the power delivery networks between voltage regulator circuits 311, 312, and 313 and IC dies 301, 302, and 303, respectively.

Voltage sense signals VSN1, VSN2, and VSN3 are provided to inputs of voltage regulator circuits 311, 312, and 313, respectively. Voltage regulator circuits 311, 312, and 313 independently adjust the supply voltages VCC1, VCC2, and VCC3 based on the voltages of the voltage sense signals VSN1, VSN2, and VSN3, respectively, to compensate for the IR voltage drops in the power delivery networks. For example, voltage regulator circuit 311 can increase or decrease supply voltage VCC1 in response to voltage sense signal VSN1 indicating an IR voltage drop in supply voltage VCC1 to cause supply voltage VCC1 as received by circuits in IC die 301 to equal a desired nominal supply voltage. Voltage regulator circuit 312 can increase or decrease supply voltage VCC2 in response to voltage sense signal VSN2 indicating an IR voltage drop in supply voltage VCC2 to cause supply voltage VCC2 as received by circuits in IC die 302 to equal a desired nominal supply voltage. Voltage regulator circuit 313 can increase or decrease supply voltage VCC3 in response to voltage sense signal VSN3 indicating an IR voltage drop in supply voltage VCC3 to cause supply voltage VCC3 as received by circuits in IC die 303 to equal a desired nominal supply voltage. Voltage regulator circuits 311-313 can improve the performance of the circuits in IC dies 301-303 by compensating for the IR voltage drops in the power delivery networks that deliver VCC1-VCC3, respectively.

Figure 4:
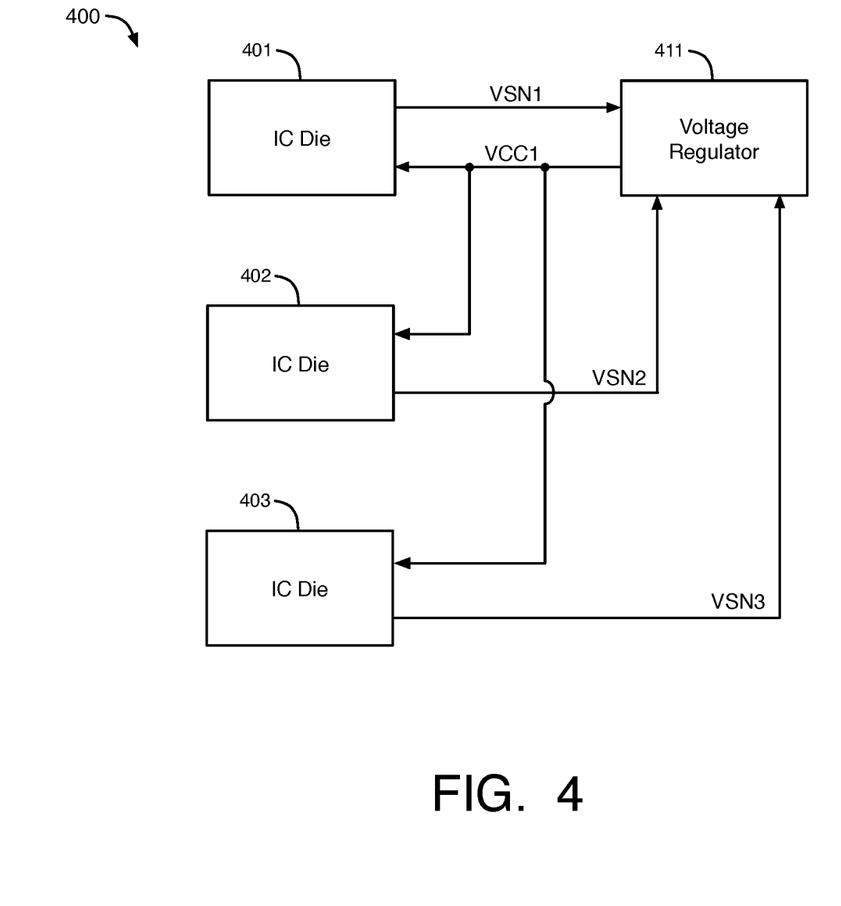
FIG. 4 illustrates an example of a circuit system for sensing and compensating for an IR voltage drop in one supply voltage provided to three integrated circuit dies, according to an embodiment.

FIG. 4 illustrates an example of a circuit system 400 for sensing and compensating for an IR voltage drop in one supply voltage provided to three integrated circuit dies, according to an embodiment. Circuit system 400 includes three integrated circuit (IC) dies 401-403 and one voltage regulator circuit 411. The IC dies 401-403 and the voltage regulator circuit 411 may be in the same IC package or in different IC packages. The IC dies 401-403 and the voltage regulator circuit 411 may, for example, be inside or outside of the IC package 100 of FIG. 1. Voltage regulator circuit 411 may, for example, be an on-board voltage regulator, an in-package voltage regulator in IC package 100, or a fully integrated voltage regulator in any of the integrated circuit dies 101 and/or 111-115 of FIG. 1. IC dies 401-403 may, for example, be three of the base IC dies 111-115. In an embodiment, one of the IC dies 401-403 may be main IC die 101. In other embodiments, IC dies 401-403 may be located in another IC package or another type of circuit system. Each of the IC dies 401-403 may be any type of IC die, such as a programmable logic IC (e.g., a field programmable gate array), a microprocessor IC, a GPU IC, a memory IC, etc.

In circuit system 400, voltage regulator circuit 411 generates one supply voltage VCC1 that is provided through conductors (shown as arrows in FIG. 4) in a power delivery network to supply inputs of IC dies 401, 402, and 403. Supply voltage VCC1 is provided from the supply inputs through conductors in power delivery networks inside IC dies 401-403 to circuits (e.g., transistors) within the IC dies 401-403. The conductors in the power delivery networks may cause IR voltage drop in the supply voltage VCC1. IR voltage drop in supply voltage VCC1 may degrade circuit performance in IC dies 401-403.

Therefore, IC dies 401, 402, and 403 generate three voltage sense signals VSN1, VSN2, and VSN3, respectively, that are used to compensate for the IR voltage drop in the supply voltage VCC1. The voltage sense signals VSN1, VSN2, and VSN3 equal the voltages of VCC1 within (or near the outside surfaces of) the IC dies 401, 402, and 403, respectively. Voltage sense signals VSN1, VSN2, and VSN3 may be coupled to the power delivery networks within (or outside of) the IC dies 401, 402, and 403, respectively. As examples, the voltage sense signals VSN1, VSN2, and VSN3 may be coupled to conductive bump layers or to conductive layers within the IC dies 401-403, respectively, in the power delivery networks.

Voltage sense signals VSN1, VSN2, and VSN3 are provided to inputs of voltage regulator circuit 411, as shown in FIG. 4. Voltage regulator circuit 411 can adjust the supply voltage VCC1 based on the voltages of the voltage sense signals VSN1, VSN2, and VSN3 to compensate for the IR voltage drop in the power delivery networks. For example, voltage regulator circuit 411 can increase or decrease supply voltage VCC1 based on an average of the IR voltage drops indicated by the voltage sense signals VSN1-VSN3 to cause supply voltage VCC1 as received by circuits in IC dies 401-403 to be closer to a desired nominal supply voltage. As another example, voltage regulator circuit 411 can increase or decrease supply voltage VCC1 based on the largest IR voltage drop indicated by the voltage sense signals VSN1-VSN3 to cause the supply voltage VCC1 as received by circuits in IC dies 401-403 to be closer to a desired nominal supply voltage.

The following examples pertain to further embodiments. Example 1 is a circuit system comprising: a power control circuit that generates first and second voltage identifiers; a first voltage regulator circuit that generates a first supply voltage based on the first voltage identifier, wherein the first supply voltage is provided to a first integrated circuit die, and wherein the power control circuit varies the first voltage identifier based on a change in a first metric associated with the first integrated circuit die to cause the first voltage regulator circuit to vary the first supply voltage; and a second voltage regulator circuit that generates a second supply voltage based on the second voltage identifier, wherein the second supply voltage is provided to a second integrated circuit die, and wherein the power control circuit varies the second voltage identifier based on a change in a second metric associated with the second integrated circuit die to cause the second voltage regulator circuit to vary the second supply voltage.

In Example 2, the circuit system of Example 1 may optionally further comprise: a third voltage regulator circuit that generates a third supply voltage based on a third voltage identifier generated by the power control circuit, wherein the third supply voltage is provided to a third integrated circuit die, and wherein the power control circuit varies the third voltage identifier based on a change in a third metric associated with the third integrated circuit die to cause the third voltage regulator circuit to vary the third supply voltage.

In Example 3, the circuit system of any one of Examples 1-2 may optionally further include, wherein the first metric is one of a performance target, a power consumption target, a frequency target, or a workload of the first integrated circuit die.

In Example 4, the circuit system of Example 3 may optionally further include, wherein the second metric is one of a performance target, a power consumption target, a frequency target, or a workload of the second integrated circuit die.

In Example 5, the circuit system of any one of Examples 1–4 may optionally further include, wherein the first voltage regulator circuit is in the first integrated circuit die, wherein the second voltage regulator circuit is in the second integrated circuit die, and wherein the power control circuit is in a third integrated circuit die.

In Example 6, the circuit system of any one of Examples 1-5 may optionally include, wherein the first voltage regulator circuit and the second voltage regulator circuit are in an integrated circuit package, and wherein the circuit system is a three-dimensional circuit system.

In Example 7, the circuit system of any one of Examples 1-6 may optionally include, wherein the power control circuit varies the first voltage identifier in response to changes in the first metric indicated by control signals generated by a circuit control system to cause the first voltage regulator circuit to vary the first supply voltage until the first metric has reached a first target value, wherein the power control circuit varies the second voltage identifier in response to changes in the second metric indicated by the control signals to cause the second voltage regulator circuit to vary the second supply voltage until the second metric has reached a second target value, and wherein the circuit control system monitors the first and second metrics.

In Example 8, the circuit system of any one of Examples 1-7 may optionally include, wherein the power control circuit varies the first voltage identifier based on a change in a workload of the first integrated circuit die to cause the first voltage regulator circuit to vary the first supply voltage, and wherein the power control circuit varies the second voltage identifier based on a change in a workload of the second integrated circuit die to cause the second voltage regulator circuit to vary the second supply voltage.

Example 9 is a method for adjusting supply voltages in a circuit system, the method comprising: generating first and second voltage identifiers using a power control circuit; generating a first supply voltage based on the first voltage identifier using a first voltage regulator circuit; providing the first supply voltage to a first integrated circuit die; varying the first voltage identifier based on a change in a first metric associated with the first integrated circuit die using the power control circuit to cause the first voltage regulator circuit to vary the first supply voltage; generating a second supply voltage based on the second voltage identifier using a second voltage regulator circuit; providing the second supply voltage to a second integrated circuit die; and varying the second voltage identifier based on a change in a second metric associated with the second integrated circuit die using the power control circuit to cause the second voltage regulator circuit to vary the second supply voltage.

In Example 10, the method of Example 9 may optionally further comprise: generating a third voltage identifier using the power control circuit; generating a third supply voltage based on the third voltage identifier using a third voltage regulator circuit; providing the third supply voltage to a third integrated circuit die; and varying the third voltage identifier based on a change in a third metric associated with the third integrated circuit die using the power control circuit to cause the third voltage regulator circuit to vary the third supply voltage.

In Example 11, the method of any one of Examples 9-10 may optionally include, wherein the first metric is one of a performance target, a power consumption target, a frequency target, or a workload of the first integrated circuit die, and wherein the second metric is one of a performance target, a power consumption target, a frequency target, or a workload of the second integrated circuit die.

In Example 12, the method of any one of Examples 9-11 may optionally include, wherein varying the first voltage identifier further comprises varying the first voltage identifier in response to changes in the first metric indicated by control signals generated by a circuit control system to cause the first voltage regulator circuit to vary the first supply voltage until the first metric has reached a first target value.

In Example 13, the method of Example 12 may optionally include, wherein varying the second voltage identifier further comprises varying the second voltage identifier in response to changes in the second metric indicated by the control signals to cause the second voltage regulator circuit to vary the second supply voltage until the second metric has reached a second target value, and wherein the circuit control system monitors the first and second metrics.

In Example 14, the method of any one of Examples 9-13 may optionally include, wherein the first voltage regulator circuit and the second voltage regulator circuit are fully integrated voltage regulators in a field programmable gate array, and wherein the method further comprises: physically organizing user logic in the field programmable gate array using timing criticality to control the fully integrated voltage regulators through soft logic for power reduction.

Example 15 is a circuit system comprising: a first voltage regulator circuit that generates a first supply voltage; and a first integrated circuit die that receives the first supply voltage from the first voltage regulator circuit through a first power delivery network, wherein the first integrated circuit die provides a first voltage sense signal that indicates the first supply voltage at the first integrated circuit die, and wherein the first voltage regulator circuit adjusts the first supply voltage based on the first voltage sense signal to compensate for voltage drop in the first power delivery network.

In Example 16, the circuit system of Example 15 may optionally further comprise: a second voltage regulator circuit that generates a second supply voltage; and a second integrated circuit die that receives the second supply voltage from the second voltage regulator circuit through a second power delivery network, wherein the second integrated circuit die provides a second voltage sense signal that indicates the second supply voltage at the second integrated circuit die, and wherein the second voltage regulator circuit adjusts the second supply voltage based on the second voltage sense signal to compensate for voltage drop in the second power delivery network.

In Example 17, the circuit system of Example 16 may optionally further comprise: a third voltage regulator circuit that generates a third supply voltage; and a third integrated circuit die that receives the third supply voltage from the third voltage regulator circuit through a third power delivery network, wherein the third integrated circuit die provides a third voltage sense signal that indicates the third supply voltage at the third integrated circuit die, and wherein the third voltage regulator circuit adjusts the third supply voltage based on the third voltage sense signal to compensate for voltage drop in the third power delivery network.

In Example 18, the circuit system of Example 15 may optionally further comprise: a second integrated circuit die that receives the first supply voltage from the first voltage regulator circuit through the first power delivery network, wherein the second integrated circuit die provides a second voltage sense signal that indicates the first supply voltage at the second integrated circuit die, and wherein the first voltage regulator circuit adjusts the first supply voltage based on the second voltage sense signal to compensate for voltage drop in the first power delivery network.

In Example 19, the circuit system of Example 18 may optionally further comprise: a third integrated circuit die that receives the first supply voltage from the first voltage regulator circuit through the first power delivery network, wherein the third integrated circuit die provides a third voltage sense signal that indicates the first supply voltage at the third integrated circuit die, and wherein the first voltage regulator circuit adjusts the first supply voltage based on the third voltage sense signal to compensate for voltage drop in the first power delivery network.

In Example 20, the circuit system of Example 15 may optionally further comprise: a second integrated circuit die that receives the first supply voltage from the first voltage regulator circuit through the first power delivery network, wherein the second integrated circuit die provides a second voltage sense signal that indicates the first supply voltage at the second integrated circuit die, and wherein the first voltage regulator circuit increases the first supply voltage by an amount that is based on a largest voltage drop in the first power delivery network that is indicated by the first voltage sense signal or the second voltage sense signal.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. A circuit system comprising:
a power control circuit that generates first and second voltage identifiers;
a first voltage regulator circuit that generates a first supply voltage based on the first voltage identifier, wherein the first supply voltage is provided to a first integrated circuit die, and wherein the power control circuit varies the first voltage identifier based on a change in a first metric associated with the first integrated circuit die to cause the first voltage regulator circuit to vary the first supply voltage;
a second voltage regulator circuit that generates a second supply voltage based on the second voltage identifier, wherein the second supply voltage is provided to a second integrated circuit die, wherein the power control circuit varies the second voltage identifier based on a change in a second metric associated with the second integrated circuit die to cause the second voltage regulator circuit to vary the second supply voltage, wherein the first voltage regulator circuit and the second voltage regulator circuit are fully integrated voltage regulators in a field programmable gate array; and
a circuit control system that physically organizes user logic in the field programmable gate array using timing criticality to control the fully integrated voltage regulators through soft logic for power reduction.

2. The circuit system of claim 1 further comprising:
a third voltage regulator circuit that generates a third supply voltage based on a third voltage identifier generated by the power control circuit, wherein the third supply voltage is provided to a third integrated circuit die, and wherein the power control circuit varies the third voltage identifier based on a change in a third metric associated with the third integrated circuit die to cause the third voltage regulator circuit to vary the third supply voltage.

3. The circuit system of claim 1, wherein the first metric is one of a performance target, a power consumption target, a frequency target, or a workload of the first integrated circuit die.

4. The circuit system of claim 1, wherein the second metric is one of a performance target, a power consumption target, a frequency target, or a workload of the second integrated circuit die.

5. The circuit system of claim 1, wherein the first voltage regulator circuit is in the first integrated circuit die, wherein the second voltage regulator circuit is in the second integrated circuit die, and wherein the power control circuit is in a third integrated circuit die.

6. The circuit system of claim 1, wherein the first voltage regulator circuit and the second voltage regulator circuit are in an integrated circuit package, and wherein the circuit system is a three-dimensional circuit system.

7. The circuit system of claim 1, wherein the power control circuit varies the first voltage identifier in response to changes in the first metric indicated by control signals generated by the circuit control system to cause the first voltage regulator circuit to vary the first supply voltage until the first metric has reached a first target value,
wherein the power control circuit varies the second voltage identifier in response to changes in the second metric indicated by the control signals to cause the second voltage regulator circuit to vary the second supply voltage until the second metric has reached a second target value, and wherein the circuit control system monitors the first and second metrics.

8. The circuit system of claim 1, wherein the power control circuit varies the first voltage identifier based on a change in a workload of the first integrated circuit die to cause the first voltage regulator circuit to vary the first supply voltage, and wherein the power control circuit varies the second voltage identifier based on a change in a workload of the second integrated circuit die to cause the second voltage regulator circuit to vary the second supply voltage.

9. A method for adjusting voltages in a circuit system, the method comprising:
generating first and second voltage identifiers using a power control circuit;
generating a first supply voltage based on the first voltage identifier using a first voltage regulator circuit;
providing the first supply voltage to a first integrated circuit die;
varying the first voltage identifier based on a change in a first metric associated with the first integrated circuit die using the power control circuit to cause the first voltage regulator circuit to vary the first supply voltage;
generating a second supply voltage based on the second voltage identifier using a second voltage regulator circuit;
providing the second supply voltage to a second integrated circuit die;
varying the second voltage identifier based on a change in a second metric associated with the second integrated circuit die using the power control circuit to cause the second voltage regulator circuit to vary the second supply voltage, wherein the first voltage regulator circuit and the second voltage regulator circuit are fully integrated voltage regulators in a field programmable gate array; and
physically organizing user logic in the field programmable gate array using timing criticality to control the fully integrated voltage regulators through soft logic for power reduction.

10. The method of claim 9 further comprising:
generating a third voltage identifier using the power control circuit;
generating a third supply voltage based on the third voltage identifier using a third voltage regulator circuit;
providing the third supply voltage to a third integrated circuit die; and
varying the third voltage identifier based on a change in a third metric associated with the third integrated circuit die using the power control circuit to cause the third voltage regulator circuit to vary the third supply voltage.

11. The method of claim 9, wherein the first metric is one of a performance target, a power consumption target, a frequency target, or a workload of the first integrated circuit die, and wherein the second metric is one of a performance target, a power consumption target, a frequency target, or a workload of the second integrated circuit die.

12. The method of claim 9, wherein varying the first voltage identifier further comprises varying the first voltage identifier in response to changes in the first metric indicated by control signals generated by a circuit control system to cause the first voltage regulator circuit to vary the first supply voltage until the first metric has reached a first target value.

13. The method of claim 12, wherein varying the second voltage identifier further comprises varying the second voltage identifier in response to changes in the second metric indicated by the control signals to cause the second voltage regulator circuit to vary the second supply voltage until the second metric has reached a second target value, and wherein the circuit control system monitors the first and second metrics.

14. The method of claim 9, wherein
physically organizing the user logic in the field programmable gate array using timing criticality to control the fully integrated voltage regulators through the soft logic for power reduction further comprises adjusting the first and the second supply voltages to meet timing requirements of logic serviced by the fully integrated voltage regulators.

15. A circuit system comprising:
a first voltage regulator circuit that generates a first supply voltage; and
a first integrated circuit die that receives the first supply voltage from the first voltage regulator circuit through a first power delivery network, wherein the first integrated circuit die provides a first voltage sense signal that equals the first supply voltage within the first integrated circuit die, and wherein the first voltage regulator circuit adjusts the first supply voltage based on the first voltage sense signal to compensate for voltage drop in the first power delivery network.

16. The circuit system of claim 15 further comprising:
a second voltage regulator circuit that generates a second supply voltage; and
a second integrated circuit die that receives the second supply voltage from the second voltage regulator circuit through a second power delivery network, wherein the second integrated circuit die provides a second voltage sense signal that equals the second supply voltage within the second integrated circuit die, and wherein the second voltage regulator circuit adjusts the second supply voltage based on the second voltage sense signal to compensate for voltage drop in the second power delivery network.

17. The circuit system of claim 16 further comprising:
a third voltage regulator circuit that generates a third supply voltage; and
a third integrated circuit die that receives the third supply voltage from the third voltage regulator circuit through a third power delivery network, wherein the third integrated circuit die provides a third voltage sense signal that equals the third supply voltage within the third integrated circuit die, and wherein the third voltage regulator circuit adjusts the third supply voltage based on the third voltage sense signal to compensate for voltage drop in the third power delivery network.

18. The circuit system of claim 15 further comprising:
a second integrated circuit die that receives the first supply voltage from the first voltage regulator circuit through the first power delivery network, wherein the second integrated circuit die provides a second voltage sense signal that equals the first supply voltage within the second integrated circuit die, and wherein the first voltage regulator circuit adjusts the first supply voltage based on the second voltage sense signal to compensate for voltage drop in the first power delivery network.

19. The circuit system of claim 18 further comprising:
a third integrated circuit die that receives the first supply voltage from the first voltage regulator circuit through the first power delivery network, wherein the third integrated circuit die provides a third voltage sense signal that equals the first supply voltage within the third integrated circuit die, and wherein the first voltage regulator circuit adjusts the first supply voltage based on the third voltage sense signal to compensate for voltage drop in the first power delivery network.

20. The circuit system of claim 15 further comprising:
a second integrated circuit die that receives the first supply voltage from the first voltage regulator circuit through the first power delivery network, wherein the second integrated circuit die provides a second voltage sense signal that indicates the first supply voltage at the second integrated circuit die, and wherein the first voltage regulator circuit increases the first supply voltage by an amount that is based on a largest voltage drop in the first power delivery network that is indicated by the first voltage sense signal or the second voltage sense signal.

* * * * *